United States Patent
Liu et al.

(10) Patent No.: US 11,127,725 B2
(45) Date of Patent: Sep. 21, 2021

(54) SEMICONDUCTOR STRUCTURE AND ASSOCIATED MANUFACTURING METHOD

(71) Applicant: TAIWAN SEMICONDUCTOR MANUFACTURING COMPANY LTD., Hsinchu (TW)

(72) Inventors: Ping-Yin Liu, Taipei County (TW); Yeong-Jyh Lin, Nantou County (TW); Chi-Ming Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/794,945

(22) Filed: Feb. 19, 2020

(65) Prior Publication Data
US 2020/0185369 A1 Jun. 11, 2020

Related U.S. Application Data

(62) Division of application No. 16/006,813, filed on Jun. 12, 2018, now Pat. No. 10,622,342.
(Continued)

(51) Int. Cl.
*H01L 29/18* (2006.01)
*H01L 33/00* (2010.01)
(Continued)

(52) U.S. Cl.
CPC ........ *H01L 25/167* (2013.01); *H01L 23/5226* (2013.01); *H01L 25/0753* (2013.01);
(Continued)

(58) Field of Classification Search
CPC ... H01L 25/167; H01L 33/0093; H01L 33/44; H01L 25/0753; H01L 23/5226; H01L 33/0075; H01L 33/62
See application file for complete search history.

(56) References Cited

U.S. PATENT DOCUMENTS 7,919,783 B2 * 4/2011 Ushikubo ........... H01L 51/5036
257/89
9,559,081 B1 1/2017 Lai et al.
(Continued)

FOREIGN PATENT DOCUMENTS

CN CN1619846 A 5/2005
CN CN106129237 A 11/2016
(Continued)

OTHER PUBLICATIONS

Office Action and Search Report dated Jun. 3, 2020 issued by China National Intellectual Property Office for counterpart application No. 201811324426.7.
(Continued)

*Primary Examiner* — Ismail A Muse
(74) *Attorney, Agent, or Firm* — WPAT, P.C.; Anthony King

(57) ABSTRACT

A semiconductor structure is disclosed. The semiconductor structure includes: a first light-emitting diode (LED) layer including a first LED of a first color type, the first LED layer having a first side and a second side opposite to the first side; a second LED layer over the first LED layer, the second LED layer including a second LED of a second color type, and the second LED layer having a first side and a second side opposite to the first side; and a third LED layer over the second LED layer, the third LED layer including a third LED of a third color type, and the third LED layer having a first side and a second side opposite to the first side; wherein the first color type, the second color type, and the third color type are different from each other.

20 Claims, 11 Drawing Sheets

Related U.S. Application Data

(60) Provisional application No. 62/583,319, filed on Nov. 8, 2017.

(51) Int. Cl.
*H01L 25/16* (2006.01)
*H01L 23/522* (2006.01)
*H01L 33/44* (2010.01)
*H01L 25/075* (2006.01)
*H01L 33/62* (2010.01)

(52) U.S. Cl.
CPC ...... *H01L 33/0075* (2013.01); *H01L 33/0093* (2020.05); *H01L 33/44* (2013.01); *H01L 33/62* (2013.01)

(56) References Cited

U.S. PATENT DOCUMENTS

| | | | |
|---|---|---|---|
| 2008/0116470 A1* | 5/2008 | Nishimura | H01L 25/0756 257/89 |
| 2008/0251799 A1* | 10/2008 | Ikezawa | H01L 25/0756 257/89 |
| 2010/0289046 A1 | 11/2010 | Idei | |
| 2015/0295009 A1 | 10/2015 | Wang et al. | |
| 2015/0325555 A1* | 11/2015 | Hashimoto | H01L 33/405 257/89 |
| 2016/0163940 A1* | 6/2016 | Huang | H01L 25/0756 257/89 |
| 2017/0256731 A1* | 9/2017 | Mu | H01L 51/5072 |
| 2018/0211943 A1* | 7/2018 | Song | H01L 25/105 |
| 2018/0366450 A1* | 12/2018 | Gardner | H01L 33/0093 |
| 2019/0165038 A1* | 5/2019 | Chae | H01L 27/156 |
| 2019/0198565 A1* | 6/2019 | Lee | H01L 33/405 |
| 2019/0206927 A1* | 7/2019 | Lee | H01L 33/08 |
| 2020/0303451 A1* | 9/2020 | Chae | H01L 27/156 |

FOREIGN PATENT DOCUMENTS

| | | |
|---|---|---|
| CN | 106298715 A | 1/2017 |
| CN | 106558577 A | 4/2017 |
| CN | 107210293 A | 9/2017 |
| CN | 110462850 A | 11/2019 |
| TW | 201431021 A | 8/2014 |
| TW | 201622100 A | 6/2016 |

OTHER PUBLICATIONS

Office Action and Search Report dated Dec. 24, 2020 issued by China National Intellectual Property Administration for counterpart application No. 201811324426.7.

* cited by examiner

SEMICONDUCTOR STRUCTURE AND ASSOCIATED MANUFACTURING METHOD

CROSS REFERENCE TO RELATED APPLICATIONS

This application is a divisional application of U.S. application Ser. No. 16/006,813, filed Jun. 12, 2018, which claims the benefit of U.S. provisional application 62/583,319, filed on Nov. 8, 2017, which is incorporated by reference in its entirety.

BACKGROUND

Light-emitting diode (LED) devices has experienced rapid growth in recent years. LED devices emit light when a voltage is applied. LED devices have increasingly gained popularity due to favorable characteristics such as small device size, long lifetime, efficient energy consumption, and good durability and reliability.

The fabrication of LED devices may involve a die-to-wafer bonding process, in which a plurality of LED dies are bonded to a plurality of bonding pads on a wafer. Conventional die-to-wafer bonding processes use auto die-bonding machines with a flux reflow oven or eutectic die-to-wafer bonders. During the bonding process, LED dies shift their lateral positions with respect to the bonding pads in any given direction. In some cases, the die-shift may exceed +/−38 microns. As the LED die size continues to decrease, the die-shift of conventional LED bonding processes is becoming a bigger issue because the reduction of reliability and performance for smaller LED devices is greater.

Therefore, although conventional LED die-to-wafer bonding processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
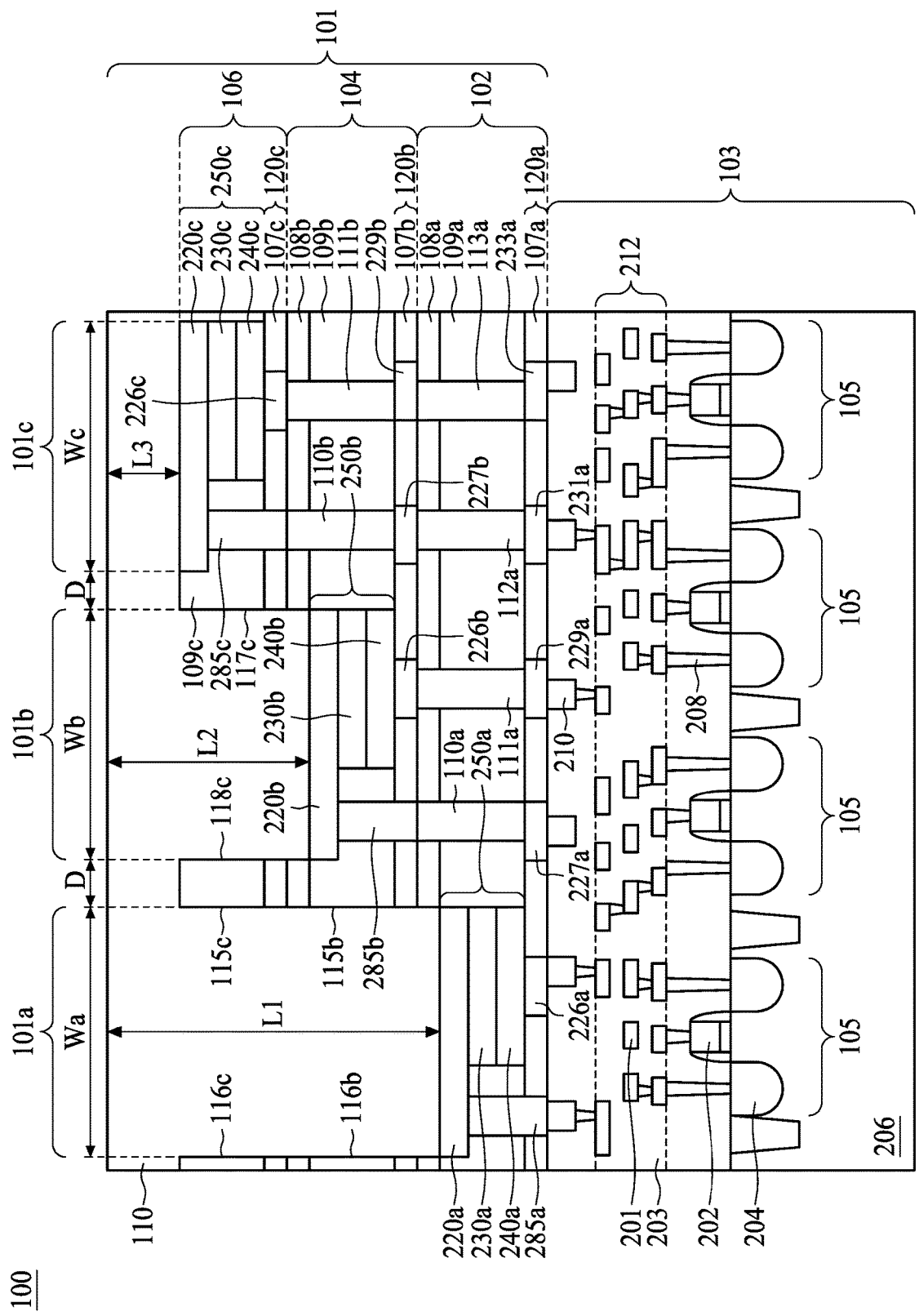
FIG. 1 is a diagram illustrating a cross-sectional view of a semiconductor structure including a CMOS (complementary metal-oxide-semiconductor) chip and a stacked light emitting diode (LED) structure bonded thereon in accordance with an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a cross-sectional view of a semiconductor structure 100 including a CMOS (complementary metal-oxide-semiconductor) chip 103 and a stacked light emitting diode (LED) structure 101 bonded thereon in accordance with an exemplary embodiment of the present disclosure. The semiconductor structure 100 includes an array of LED units 101a, 101b and 101c as shown in FIG. 1 for illustrative purpose. In many instances, the semiconductor structure 100 may include more than three LED units. The CMOS chip 103 includes a plurality of active devices 105 disposed therein. In some embodiments, the CMOS chip 103 includes an interconnect structure 212 disposed over a substrate 206. In some embodiments, the interconnect structure 212 includes a plurality of metal features 201 disposed within an inter-layer dielectric (ILD) layer 203. The active devices 105 are disposed at least in the substrate 206. In some embodiments, the active devices 105 may include control circuit to control current flowing through the LED units 101a, 101b and 101c to a given required value. The active devices 105 may also include other logic circuits. For example, the active devices 105 may include a transistor device having a gate structure 202 and source/drain regions 204.

Each of the LED units 101a to 101c includes an LED structure disposed within a corresponding layer. In particular, the LED structure of the LED unit 101a is disposed in a first LED layer 102; the LED structure of the LED unit 101b is disposed in a second LED layer 104 over the first LED layer 102; the LED structure of the LED unit 101c is disposed in a third LED layer 106 over the second LED layer 104. Exemplary LED structures include micro-LED (μLED) devices. In order to avoid light scattering and cross-talk, each two adjacent LED units are separated by a distance D greater than 0. In this way, each two adjacent LED units does not overlap each other from a top view. In many instances, the distance D may be greater than 1 μm.

In LED displays, multiple LED units are often used in to form a color image pixel. In one example, three separate light sources for red, green, and blue in separate LED unit having similar or different compositions, individual optics and control are grouped or driven together to form one pixel. In an exemplary embodiment of the present disclosure, the topmost third LED layer 106 is a red light LED unit due to that a substrate of red light LED unit process may be different from a substrate of blue or green light LED unit. The details will be described in the subsequent paragraphs. In many instances, the LED unit 101a is a blue light LED unit; the LED unit 101b is a green light LED unit; and the LED unit 101c is a red light LED unit. However, this is not a limitation of the present disclosure. In many instances, the colors of the LED units 101a, 101b and 101c may be interchangeable.

The LED structure of the LED unit 101a includes an epitaxial structure 250a having various epitaxy layers 220a, 230a, and 240a. The epitaxial structure 250a is configured as a light emitting diode and includes at least an n-typed doped semiconductor layer and a p-type doped semiconductor layer configured to emit radiation. In an example, the epitaxy layers include a single quantum well (SQW) structure disposed between the n-type doped semiconductor layer and the p-type doped semiconductor layer. The SQW structure includes two different semiconductor materials and can be used to tune the wavelength of the LED. Alternatively, a multiple quantum well (MQW) structure is interposed between the n-type doped semiconductor layer and the p-type doped semiconductor layer. The MQW structure includes a plurality of SQWs in a stack. The MQW structure preserves advantages of the SQW structure and has a larger volume of active region, allowing higher lighting power. In the depicted embodiment, the epitaxy layers 220a, 230a, and 240a include GaN based semiconductor materials configured to form GaN-based LEDs that emit blue light, ultraviolet (UV) light, or both. For example, the epitaxy layer 240a is a p-type doped GaN (p-GaN) layer, the epitaxy layer 230a is a MQW structure disposed over the epitaxy layer 240a, the epitaxy layer 220a is an n-type doped GaN layer (n-GaN layer) disposed over the epitaxy layer 230a.

The epitaxy layer 220a (n-GaN layer) may include a gallium nitride layer doped with an n-type dopant, such as silicon or oxygen. In an example, a buffer layer, such as an undoped GaN layer or an aluminum nitride (AlN) layer, may be disposed over the epitaxy layer 220a. The epitaxy layer 230a (MQW structure) may include a plurality of pairs of semiconductor films, such as from about 5 pairs to about 15 pairs of semiconductor films. In an example, each pair of semiconductor films includes an indium gallium nitride (InGaN) film and a gallium nitride (GaN) film (forming InGaN/GaN pairs). The InGaN/GaN films can be doped with an n-type dopant. In another example, each pair of semiconductor films includes an aluminum gallium nitride (AlGaN) film and a gallium nitride film (forming AlGaN/GaN pairs). The AlGaN/GaN films can be doped with an n-type dopant. The epitaxy layer 240a (p-GaN layer) may include a gallium nitride layer doped with a p-type dopant, such as magnesium, calcium, zinc beryllium, carbon, or combinations thereof.

As shown in FIG. 1, a width Wa of the LED unit 101a is substantially the same to a width of the epitaxy layer 220a. The epitaxy layer 230a has a width substantially the same with a width of the epitaxy layer 240a and less than the width Wa. In other words, the width of the epitaxy layer 220a is substantially greater than the width of the epitaxy layer 230a and the epitaxy layer 240a. In addition, the epitaxy layer 230a is positioned with its sidewalls (including a left sidewall and a right sidewall as depicted) aligned with sidewalls (including a left sidewall and a right sidewall as depicted) of the epitaxy layer 240a. A right sidewall of the epitaxy layer 220 is aligned with the right sidewall of the epitaxy layer 230a and the right sidewall of the epitaxy layer 240a. A left sidewall of the epitaxy layer 220 laterally protrudes from the left sidewall of the epitaxy layer 230a and the left sidewall of the epitaxy layer 240a. As such, a portion of a bottom surface of the epitaxy layer 220 is covered by the epitaxy layer 230a and a remaining portion of the bottom surface of the epitaxy layer 220 is not covered by the epitaxy layer 230a.

The first LED layer 102 includes a dielectric material 109a, such as silicon oxide, silicon nitride, silicon oxynitride, silicon carbide, epoxy, polyimide, benzocyclobutene (BCB), polybenzoxazole (PBO), other suitable dielectric material, or combinations thereof, seals and protects various features of the first LED layer 102, such as the epitaxial structure 250a. A top surface of the dielectric material 109a is substantially coplanar with a top surface of the epitaxy layer 220a. A bottom surface of the dielectric material 109a is substantially coplanar with a bottom surface of the epitaxy layer 240a. The first LED layer 102 may further include a redistribution layer (RDL) 120a between the dielectric material 109a and the CMOS chip 103. The RDL 120a provides electrical channels and mechanical support. In many instances, the RDL 120a may include conductive structures 285a, 226a, 227a, 229a, 231a and 233a. In some embodiments, the conductive structures 285a, 226a, 227a, 229a, 231a and 233a may be comprised of copper, for example. Gaps between the conductive structures 285a, 226a, 227a, 229a, 231a and 233a may be filled by a dielectric material 107a, such as silicon oxide, silicon nitride, silicon oxynitride, silicon carbide, epoxy, polyimide, benzocyclobutene (BCB), polybenzoxazole (PBO), other suitable dielectric material, or combinations thereof.

The conductive structure 226a may be used to couple the epitaxy layer 240a to the active devices 105 in the CMOS chip 103 through a top metal layer 210 of the plurality of metal features 201. In many instances, a top end of the conductive structure 226a is in physical contact with the epitaxy layer 240a; and a bottom end of the conductive structure 226a is in physical contact with the top metal layer 210. The conductive structure 285a may be used to couple the epitaxy layer 220a to the active devices 105 in the CMOS chip 103 through the through the top metal layer 210 of the plurality of metal features 201. In many instances, the conductive structure 285a passes through the dielectric material 109a and a top end of the conductive structure 285a is in physical contact with the epitaxy layer 220a; and a bottom end of the conductive structure 285a is in physical contact with the top metal layer 210.

The first LED layer 102 may further include a dielectric material 108a, such as silicon oxide, silicon nitride, silicon oxynitride, silicon carbide, epoxy, polyimide, benzocyclobutene (BCB), polybenzoxazole (PBO), other suitable dielectric material, or combinations thereof, over the dielectric material 109a. In the exemplary embodiment, the dielectric material 108a covers the dielectric material 109a, and the epitaxy layer 220a is uncovered by the dielectric material 108a. For example, the dielectric material 108a does not overlap the epitaxy layer 220a. Conductive structures 110a, 111a, 112a and 113a pass through the dielectric material 108a and the dielectric material 109a as shown in FIG. 1 for illustrative purpose. The conductive structures 110a, 111a, 112a and 113a may be comprised of copper, for example, and used to couple the second LED layer 104 and/or the third LED layer 106 to the active devices 105 in the CMOS chip 103 through the RDL 120a and the top metal layer 210 of the plurality of metal features 201. In many instances, the conductive structures 110a, 111a, 112a and 113a pass through the dielectric material 109a and the dielectric material 108a. A top end of each of the conductive structures 110a, 111a, 112a and 113a is in physical contact with the second layer 104; and a bottom end of each of the conductive structures 110a, 111a, 112a and 113a is in physical contact with the conductive structures 227a, 229a, 231a and 233a in the RDL 120a respectively.

The LED structure of the LED unit 101b includes an epitaxial structure 250b having various epitaxy layers 220b, 230b, and 240b. The epitaxial structure 250b may be substantially the same or similar to the epitaxial structure 250a as described above. However, this is not a limitation of the present disclosure. As shown in FIG. 1, a width Wb of the LED unit 101a is substantially the same to a width of the epitaxy layer 220b. The epitaxy layer 230b has a width substantially the same with a width of the epitaxy layer 240b and less than the width Wb. In other words, the width of the epitaxy layer 220b is substantially greater than the width of the epitaxy layer 230b and the epitaxy layer 240b. Details of the epitaxial structure 250b may be substantially the same or similar to the epitaxial structure 250a.

The second LED layer 104 includes a dielectric material 109b, such as silicon oxide, silicon nitride, silicon oxynitride, silicon carbide, epoxy, polyimide, benzocyclobutene (BCB), polybenzoxazole (PBO), other suitable dielectric material, or combinations thereof, seals and protects various features of the second LED layer 104, such as the epitaxial structure 250b. A top surface of the dielectric material 109b is substantially coplanar with a top surface of the epitaxy layer 220b. A bottom surface of the dielectric material 109b is substantially coplanar with a bottom surface of the epitaxy layer 240b. The second LED layer 104 may further include a redistribution layer (RDL) 120b between the dielectric material 109b and the first LED layer 102. The RDL 120b provides electrical channels and mechanical support. In many instances, the RDL 120b may include conductive structures 285b, 226b, 227b, and 229b. In some embodiments, the conductive structures 285b, 226b, 227b and 229b may be comprised of copper, for example. Gaps between the conductive structures 285b, 226b, 227b, and 229b may be filled by a dielectric material 107b, such as silicon oxide, silicon nitride, silicon oxynitride, silicon carbide, epoxy, polyimide, benzocyclobutene (BCB), polybenzoxazole (PBO), other suitable dielectric material, or combinations thereof.

The conductive structure 226b may be used to couple the epitaxy layer 240b to the active devices 105 in the CMOS chip 103 through the conductive structures 111a and 229a of the first LED layer 102. In many instances, a top end of the conductive structure 226b is in physical contact with the epitaxy layer 240b; and a bottom end of the conductive structure 226b is in physical contact with the conductive structures 111a. The conductive structure 285b may be used to couple the epitaxy layer 220b to the active devices 105 in the CMOS chip 103 through the through the conductive structures 110a and 227a of the first LED layer 102. In many instances, the conductive structure 285b passes through the dielectric material 109b and a top end of the conductive structure 285b is in physical contact with the epitaxy layer 220b; and a bottom end of the conductive structure 285b is in physical contact with the conductive structures 110a.

The second LED layer 104 may further include a dielectric material 108b, such as silicon oxide, silicon nitride, silicon oxynitride, silicon carbide, epoxy, polyimide, benzocyclobutene (BCB), polybenzoxazole (PBO), other suitable dielectric material, or combinations thereof, over the dielectric material 109b. In the exemplary embodiment, the dielectric material 108b covers the dielectric material 109b, and the epitaxy layer 220b is uncovered by the dielectric material 108b. For example, the dielectric material 108b does not overlap the epitaxy layer 220b. Conductive structures 110b and 111b pass through the dielectric material 108b and the dielectric material 109b as shown in FIG. 1 for illustrative purpose. The conductive structures 110b and 111b may be comprised of copper, for example, and used to couple the third LED layer 106 to the active devices 105 in the CMOS chip 103 through the RDL 120a and the top metal layer 210 of the plurality of metal features 201. In many instances, the conductive structures 110b and 111b pass through the dielectric material 109b and the dielectric material 108b. A top end of each of the conductive structures 110b and 111b is in physical contact with the third layer 106; and a bottom end of each of the conductive structures 110b and 111b is in physical contact with the conductive structures 227b and 229b respectively.

As shown in FIG. 1, the second LED layer 104 is over the first LED layer 102 and covers at least a portion of the first LED layer 102. In some embodiments, at least the LED unit 101a is uncovered by the second LED layer 104. For example, the second LED layer 104 does not overlap the epitaxial structure 250a. A first sidewall 115b of the second LED layer 104 may be aligned with a right sidewall of the epitaxial structure 250a. A second sidewall 116b of the second LED layer 104 may be aligned with a left sidewall of the epitaxial structure 250a.

The LED structure of the LED unit 101c includes an epitaxial structure 250c having various epitaxy layers 220c, 230c, and 240c. The epitaxial structure 250c may be substantially the same or similar to the epitaxial structures 250a and 250b as described above. However, this is not a limitation of the present disclosure. As shown in FIG. 1, a width Wc of the LED unit 101c is substantially the same to a width of the epitaxy layer 220c. The epitaxy layer 230c has a width substantially the same with a width of the epitaxy layer 240c and less than the width Wc. In other words, the width of the epitaxy layer 220c is substantially greater than the width of the epitaxy layer 230c and the epitaxy layer 240c. Details of the epitaxial structure 250c may be substantially the same or similar to the epitaxial structures 250a or 250b.

The third LED layer 106 includes a dielectric material 109c, such as silicon oxide, silicon nitride, silicon oxynitride, silicon carbide, epoxy, polyimide, benzocyclobutene (BCB), polybenzoxazole (PBO), other suitable dielectric material, or combinations thereof, seals and protects various features of the third LED layer 106, such as the epitaxial structure 250c. A top surface of the dielectric material 109c is substantially coplanar with a top surface of the epitaxy layer 220c. A bottom surface of the dielectric material 109c is substantially coplanar with a bottom surface of the epitaxy layer 240c. The third LED layer 106 may further include a redistribution layer (RDL) 120c between the dielectric material 109c and the second LED layer 104. The RDL 120c provides electrical channels and mechanical support. In many instances, the RDL 120c may include conductive structures 285c and 226c. In some embodiments, the conductive structures 285c and 226c may be comprised of copper, for example. Gaps between the conductive structures 285c and 226c may be filled by a dielectric material 107c, such as silicon oxide, silicon nitride, silicon oxynitride, silicon carbide, epoxy, polyimide, benzocyclobutene (BCB), polybenzoxazole (PBO), other suitable dielectric material, or combinations thereof.

The conductive structure 226c may be used to couple the epitaxy layer 240c to the active devices 105 in the CMOS chip 103 through the conductive structures 111b, 229b of the second LED layer 104, and conductive structures 113a, 233a of the first LED layer 102. In many instances, a top end of the conductive structure 226c is in physical contact with the epitaxy layer 240c; and a bottom end of the conductive structure 226c is in physical contact with the conductive structures 111b. The conductive structure 285c may be used to couple the epitaxy layer 220c to the active devices 105 in the CMOS chip 103 through the through the conductive structures 110b, 227b of the second LED layer 104, and the conductive structures 112a, 231a of the first LED layer 102. In many instances, the conductive structure 285c passes through the dielectric material 109c and a top end of the conductive structure 285c is in physical contact with the epitaxy layer 220c; and a bottom end of the conductive structure 285c is in physical contact with the conductive structures 110b.

As shown in FIG. 1, the third LED layer 106 is over the second LED layer 104 and covers at least a portion of the second LED layer 104. In some embodiments, at least the LED units 101a and 101b are uncovered by the third LED layer 106. For example, the third LED layer 106 does not overlap the epitaxial structures 250a and 205b. A first sidewall 117c of the third LED layer 106 may be aligned with a right sidewall of the epitaxial structure 250b. A second sidewall 118c of the second LED layer 104 may be aligned with a left sidewall of the epitaxial structure 250a. A third sidewall 115c of the third LED layer 106 may be aligned with the first sidewall 115b of the second LED layer 104 and the right sidewall of the epitaxial structure 250b. A fourth sidewall 116c of the second LED layer 104 may be aligned with the second sidewall 116b of the second LED layer 104 and the left side wall of the epitaxial structure 250a.

A transparent filling 110 may be disposed over the first LED layer 102, the second LED layer 104 and the third LED layer 106. The transparent filling 110 fills the gaps between the first LED layer 102, the second LED layer 104 and the third LED layer 106 and covers the epitaxial structures 205a, 250b and 250c. The transparent filling 110 may be a polymer or glass film that does not substantially absorb light from the excitation source, or a transparent polymer film blended with transparent fine particles. The polymer film is preferably made of a highly transparent polymer or glass. Specific examples of suitable transparent polymers include acetate resins, e.g., triacetyl cellulose (TAC), polyester resins, polyethersulfone resins, polysulfone resins, polycarbonate resins, polyolefin resins, polyallylate resins, polystyrene resins, polyvinyl alcohol resins, polyvinyl chloride resins, polyvinylidene chloride resins, and polyacrylic resins, and a combination thereof. The fine particles may be made of at least one material selected from the group consisting of silica, alumina, titania, zirconia, tin oxide, indium oxide, cadmium oxide and antimony oxide.

Since the epitaxial structures 250a, 250b and 250c are disposed at different depths, a distance between a top surface of the transparent filling 110 and the epitaxial structures 250a, 250b and 250c are different from each other. For example, a distance L1 between the top surface of the transparent filling 110 and the epitaxial structure 250a in the first LED layer 102 is greater than a distance L2 between the top surface of the transparent filling 110 and the epitaxial structure 250b in the second LED layer 104. The distance L2 is greater than a distance L3 between the top surface of the transparent filling 110 and the epitaxial structure 250c in the third LED layer 106. The semiconductor structure 100 may further include other features and/or layers depending on design requirements. In many instances, a micro-lens layer containing a plurality of micro-lenses may be formed over the transparent filling 110. The micro-lenses may be positioned in various arrangements and have various shapes depending on a refractive index of a material used for the micro-lens and distance from the LED layer.

In some embodiments, the stacked LED structure 101 and the CMOS chip 103 are bonded together by a hybrid bond including a metal-to-metal bond and a dielectric-to-dielectric bond. The metal to metal bond (e.g. a diffusion bond) can be between the conductive structures (including conductive structures 285a, 226a, 227a, 229a, 231a, 233a) in the RDL 120a and a top metal layer 210 of the plurality of metal features 201. The dielectric-to-dielectric bond can be between the dielectric material 107a and the ILD layer 203 such that the dielectric material 107a and the ILD layer 203 are in direct contact with one another. The conductive structures (including conductive structures 285a, 226a, 227a, 229a, 231a, 233a) in the RDL 120a and the top metal layer 210 function as a pair of bonding pads and can include re-distribution layers (RDLs). In some embodiments, the dielectric-to-dielectric bond is an oxide-to-oxide bond.

In order to achieve good bonding quality, some surface conditions and properties may need to meet. For example, a surface roughness of the RDL 120a may be less than about 10 Angstroms (<1 nm). In some embodiments, topography of dishing and/or erosion in metal areas, including conductive structures 285a, 226a, 227a, 229a, 231a, 233a in the RDL 120a may be no greater than about ±50 Angstroms. In some embodiments, the RDL 120a is metal oxide free. In some embodiments, the water contact angle of a bonding surface of the RDL 120a may be less than about 50 degrees, i.e. the surface of the RDL 120a is considered hydrophilic. In some embodiments, the pitch of the conductive structures (including conductive structures 285a, 226a, 227a, 229a, 231a, 233a) in the RDL 120a may be no greater than about 5 μm. In some embodiments, the line width of the conductive structures (including conductive structures 285a, 226a, 227a, 229a, 231a, 233a) in the RDL 120a may be no greater than about 2.5 μm. In some embodiments, a ratio of the pitch of the conductive structures to the line width of the conductive structures is no greater than about 5:1. For example, the ratio of the pitch of the conductive structures to the line width of the conductive structures is about 1:1.

In some embodiments, the first LED layer 102, the second LED layer 104 and the third LED layer 106 may as well have a plurality of active devices in peripheral regions around the array of LED units 101a, 101b and 101c. For instance, a portion or all of the control or logic circuits mentioned above may be disposed in the first LED layer 102, the second LED layer 104 or the third LED layer 106 instead of the CMOS chip 103.

Figure 2:
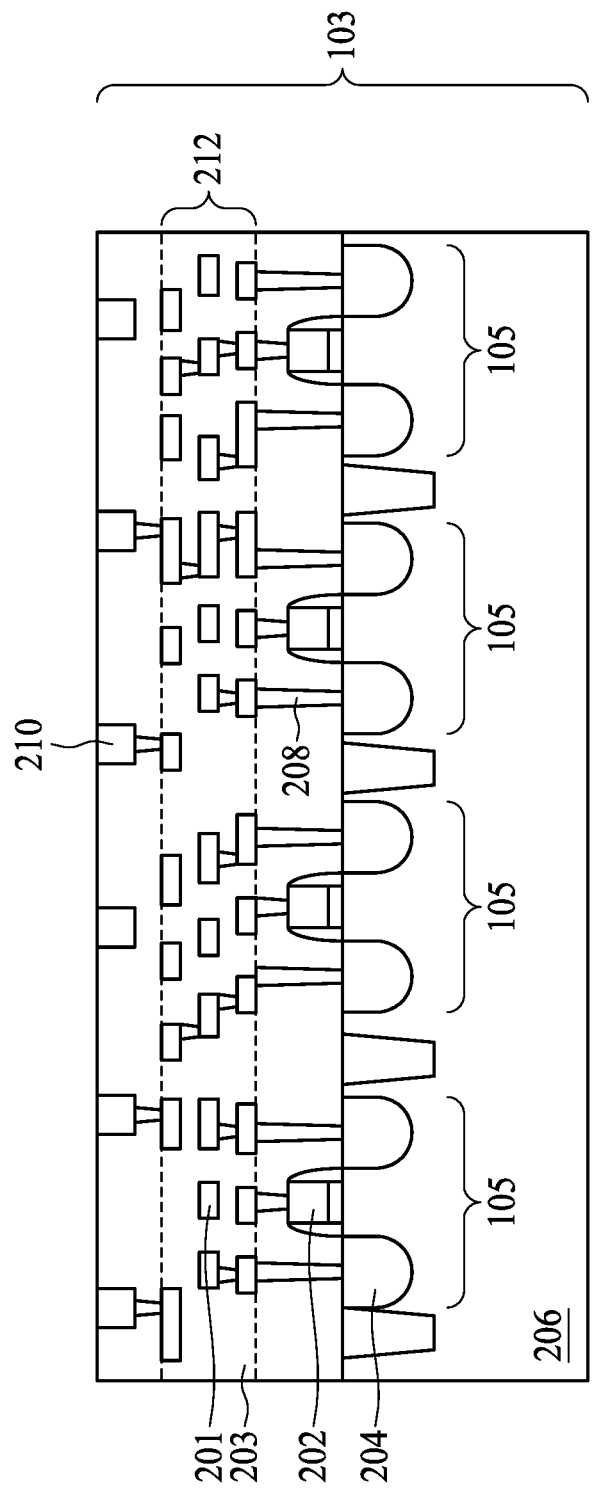
FIG. 2 to FIG. 11 are diagrams illustrating fragmentary cross-sectional views of the semiconductor structure at various stages of fabrication in accordance with a preferred embodiment of the disclosure.

FIG. 2 to FIG. 11 are diagrams illustrating fragmentary cross-sectional views of the semiconductor structure 100 at various stages of fabrication in accordance with a preferred embodiment of the disclosure. FIGS. 2-12 have been simplified for the sake of clarity to better understand the inventive concepts of the present disclosure. Additional features can be added in the semiconductor structure 100, and some of the features described below can be replaced or eliminated for additional embodiments of the semiconductor structure 100. With reference to FIG. 2, the CMOS chip 103 is provided. The CMOS chip 103 includes the substrate 206. The active devices 105 are formed within the substrate 206. In various embodiments, the substrate 206 may include any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the active devices 105 may include transistors formed by depositing the gate structure 202 over the substrate 206 and forming the source/drain regions 204 by implantation or epitaxial growth.

The interconnect structure 212 is formed over the substrate 206, to form the CMOS chip 103. In some embodiments, the interconnect structure 212 may be formed by forming the ILD layer 203, which includes one or more layers of ILD material, over the substrate 206. The ILD layer 203 is subsequently etched to form via holes and/or metal trenches. The via holes and/or metal trenches are then filled with a conductive material to form the plurality of metal features 201. In some embodiments, the ILD layer 203 may be deposited by a physical vapor deposition technique (e.g., PVD, CVD, etc.). The metal features 201 may be formed using a deposition process and/or a plating process (e.g., electroplating, electro-less plating, etc.). In various embodiments, the plurality of metal features 201 may be comprised of tungsten, copper, or aluminum copper, for example. In some embodiments, the top metal layer 210 of the plurality of metal features 201 has an upper surface aligned with an upper surface of the ILD layer 203.

Figure 3:
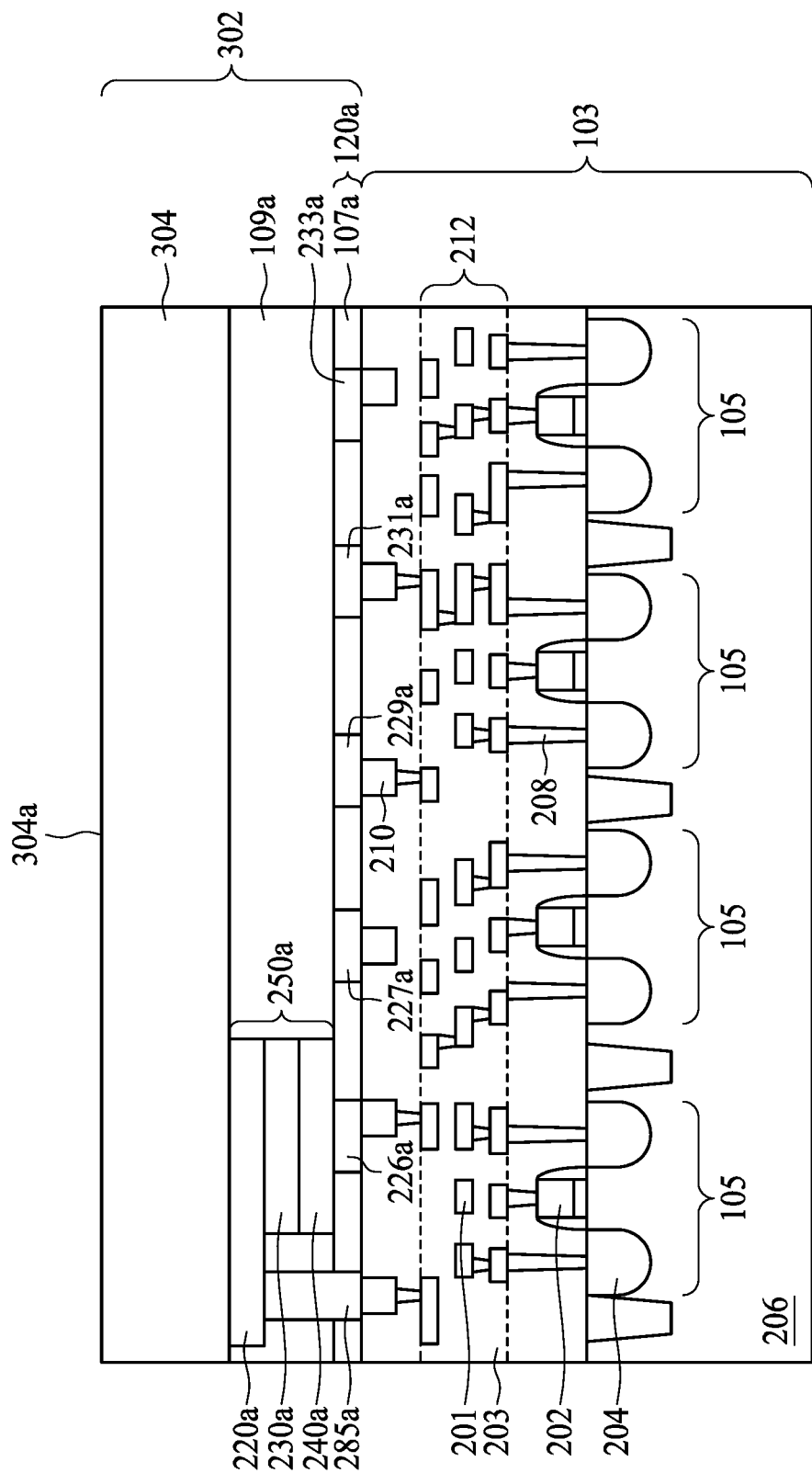

As shown in FIG. 3, a first LED chip 302 is bonded to the CMOS chip 103. The first LED chip 302 includes the epitaxial structure 250a formed on a substrate 304. In an exemplary embodiment, the epitaxial structure 250a is configured as a blue light emitting diode. However, this is not a limitation of the present disclosure. When the epitaxial structure 250a is configured as a blue light emitting diode, the substrate 304 may be a crystalline substrate, specifically a sapphire substrate. Alternatively, the substrate 304 includes silicon carbide (SiC) or other substrate material suitable for LED applications, or combinations thereof.

In some embodiments, the bonding process may form a hybrid bond including a metal-to-metal bond and a dielectric-to-dielectric bond. The top metal layer 210 and the conductive structures 285a, 226a, 227a, 229a, 231a and 233a can be bonded together in direct. The dielectric material 107a and the ILD layer 203 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the dielectric material 107a and the ILD layer 203.

In many instances, a surface treatment/activation may be carried out on a bonding surface of the CMOS chip 103 and a bonding surface of the first LED chip 302. In the surface treatment, a dry approach or a wet approach may be performed upon the bonding surfaces. The dry approach may include employing gentle plasma, such as reactive ion etching (RIE), inductively coupled plasma (ICP), capacitively coupled plasma (CCP), the like, or a combination thereof. The wet approach may include employing RCA1 or RCA2 solution for cleaning bath. The RCA1 solution may be a mixture containing ammonium hydroxide ($NH_4OH$), de-onized water (HDIW) and hydrogen peroxide ($H_2O_2$). The RCA1 solution may be heated to about 40° C. to 70° C. to remove organic particles from the surface of the wafer. The RCA2 solution may be a mixture containing hydrochloric acid (HCl), hot de-ionized water (HDIW) and hydrogen peroxide ($H_2O_2$). The RCA2 solution is heated to about 40° C. to 80° C. to remove metallic impurities and particles from the surface of the wafer. Afterward, the bonding surfaces become hydrophilic, and the exposed surface of the dielectric material 107a and the ILD layer 203 are activated.

Then, to remove the metal oxide, e.g. copper oxide, chemical, particle, or other unwanted material from the bonding surface, a surface cleaning step is performed on the package components. A wet etch processing may be performed for the metal oxide removal. In one embodiment, the surface cleaning step utilized in the exemplary embodiments and methodologies described herein could include, for example, a thermal treatment under forming gas (e.g., 4% H2/N2, 4% H2/He, 4% H2/Ar, pure H2, etc.), forming acid (e.g. $HCO_2H$), HCl, citric acid, plasma (e.g., $H_2$), PCII (e.g., Ar sputter), or UV erasing under an $H_2$ environment process. During the hybrid bonding, a pressing force is applied to press the CMOS chip 103 and the first LED chip 302 against each other. The pressing force may be lower than about 1 Kilonewton, which may be applied to the centers of the CMOS chip 103 and the first LED chip 302. The hybrid bonding may be performed at a temperature lower than about 50° C.

An anneal process may be performed after the bonding at a temperature of about 100 to 500° C., as an example. The grain size of the Cu of the top metal layer 210 and the conductive structures 285a, 226a, 227a, 229a, 231a and 233a may be about 0.1 to 5 µm after the anneal process, with a bond strength larger than about 0.5 J/m² in an embodiment, for example. The hybrid bonding process may be performed in an $N_2$ environment, an Ar environment, a He environment, an (about 4 to 10% H2)/(about 90 to 96% inert gas or N2) environment, an inert-mixing gas environment, combinations thereof, or other types of environments.

Figure 4:
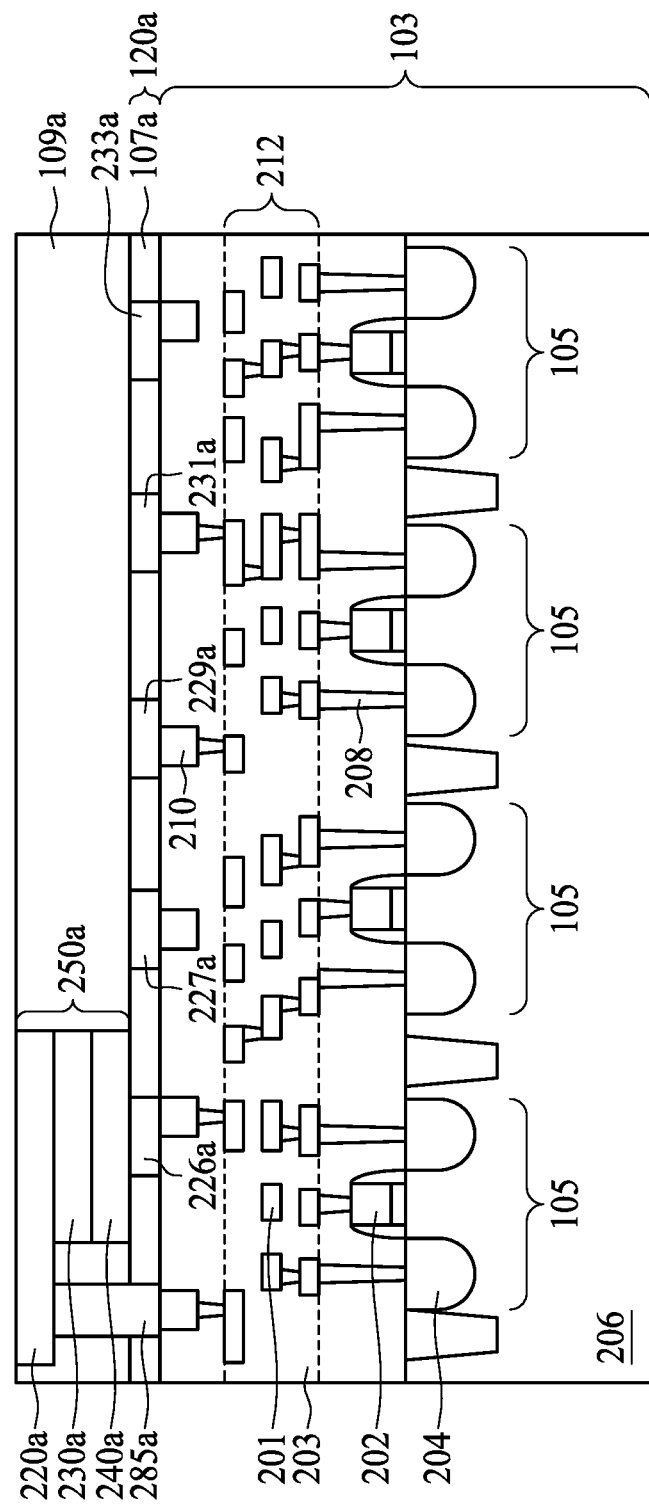

Wither reference to FIG. 4, a laser lift-off (LLO) may be performed on the substrate 304 to remove the substrate 304. In some embodiments, a portion of the substrate 304 may be removed first by thinning a back surface 304a of the substrate 304. In other words, the removal of the substrate 304 may be accomplished in one operation or several operations. In many instances, the substrate 304 may be removed by dry or wet etching, lapping, grinding, CMP (chemical mechanical polish), or combinations thereof.

Figure 5:
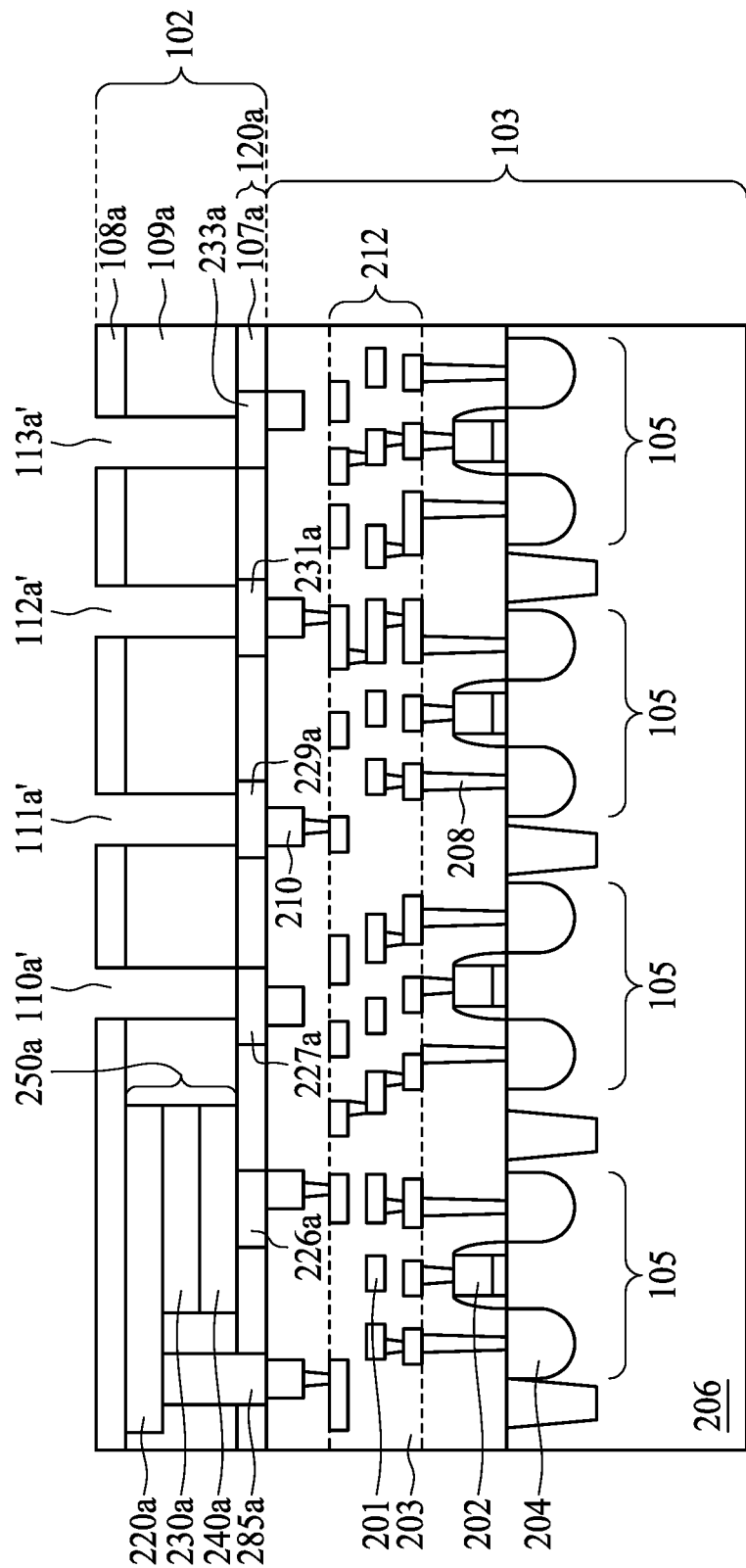
Figure 6:
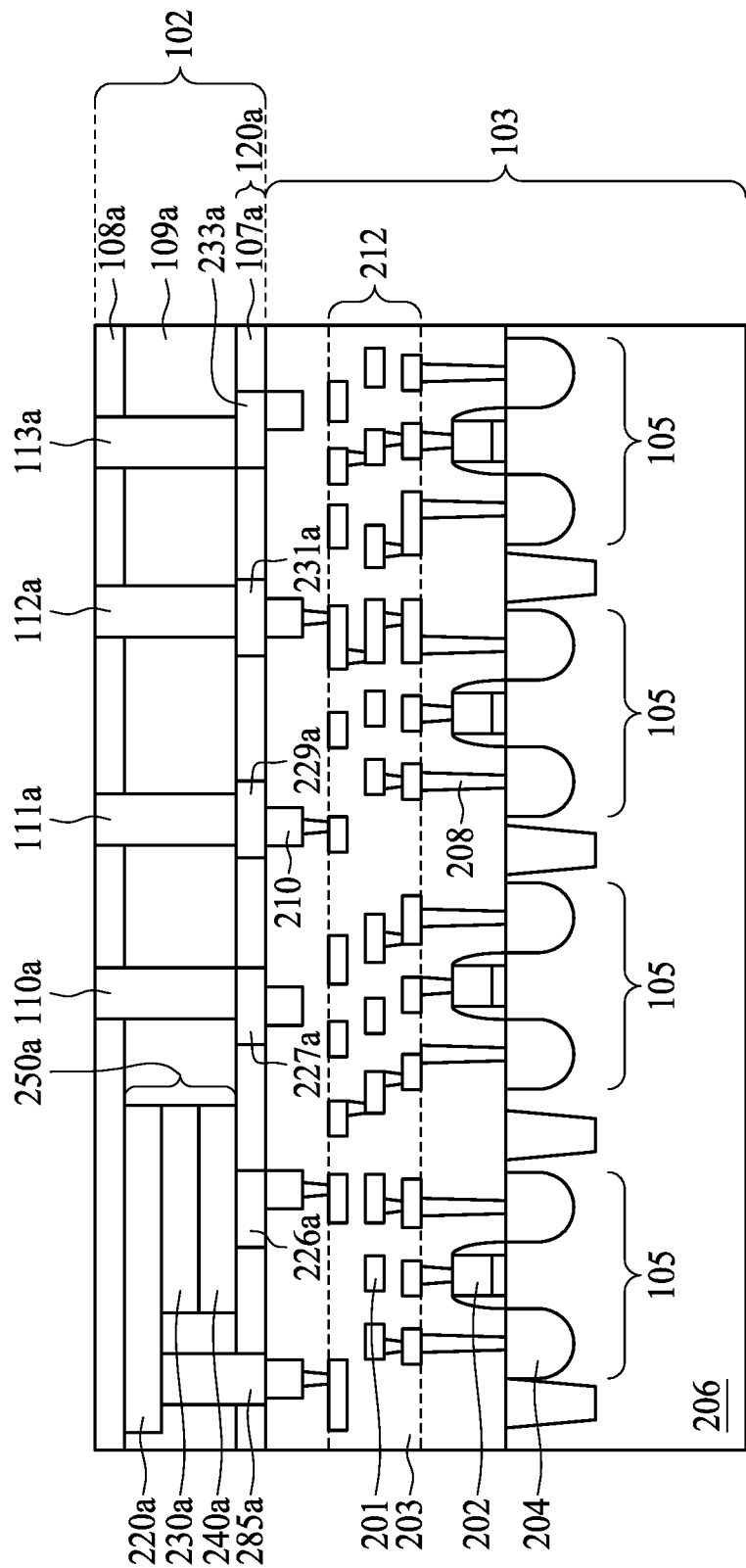

With reference to FIG. 5, the dielectric material 108a is formed on the dielectric material 109a. The dielectric materials 108a and 109a are subsequently etched to form via holes 110a', 111a', 112a', and 113a'. The via holes are then filled with a conductive material such as copper to form the conductive structures 110a, 111a, 112a and 113a passing through the dielectric material 108a and the dielectric material 109a as shown in FIG. 6.

Figure 7:
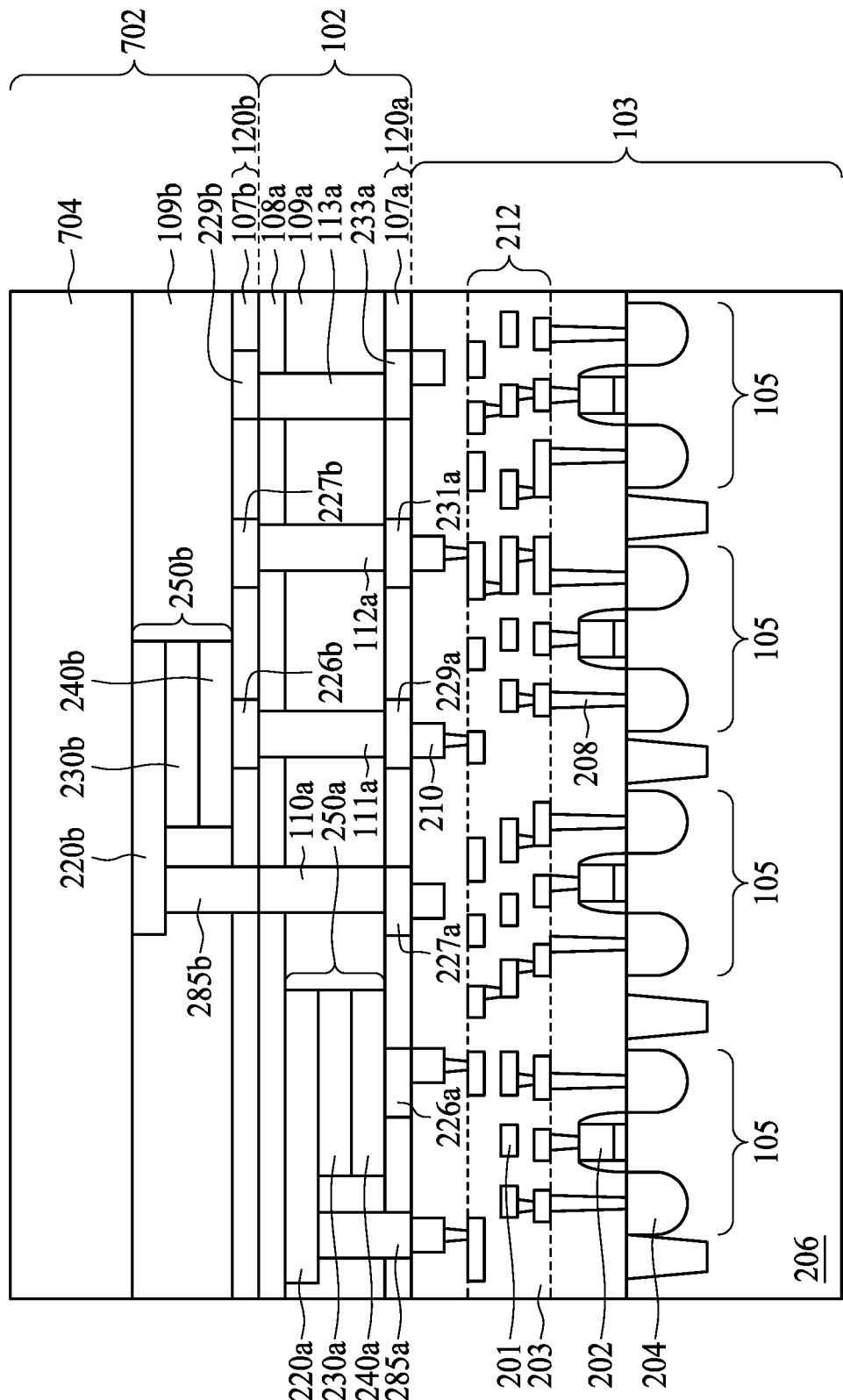

As shown in FIG. 7, a second LED chip 702 is bonded to the fits LED layer 102 of the first LED chip 302. The second LED chip 702 includes the epitaxial structure 250b formed on a substrate 704. In an exemplary embodiment, the epitaxial structure 250b is configured as a green light emitting diode. However, this is not a limitation of the present disclosure. When the epitaxial structure 250a is configured as a green light emitting diode, the substrate 704 may be a crystalline substrate, specifically a sapphire substrate. Alternatively, the substrate 704 includes gallium phosphide (GaP) or other substrate material suitable for LED applications, or combinations thereof. The bonding process may be substantially the same or similar to the bonding process of the first LED chip 302 and the CMOS chip 103. Therefore the details are omitted here for conciseness.

Figure 8:
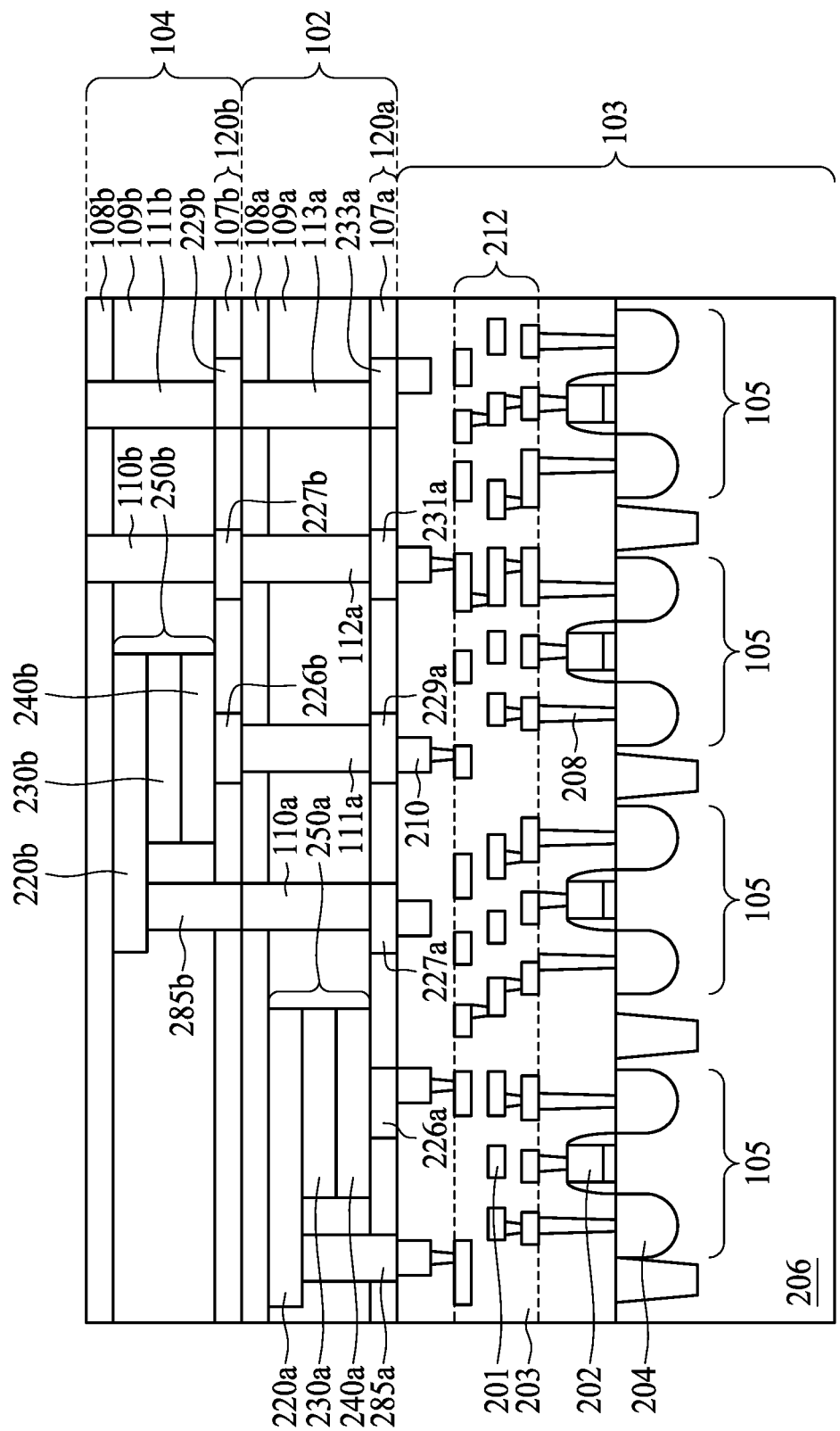

With reference to FIG. 8, the substrate 704 may be removed through a process substantially the same or similar to the removal of the substrate 304. The dielectric material 108b is formed on the dielectric material 109b. The dielectric materials 108b and 109b are subsequently etched to form via holes, and then the via holes are filled with a conductive material such as copper to form the conductive structures 110b and 111b passing through the dielectric material 108b and the dielectric material 109b.

Figure 9:
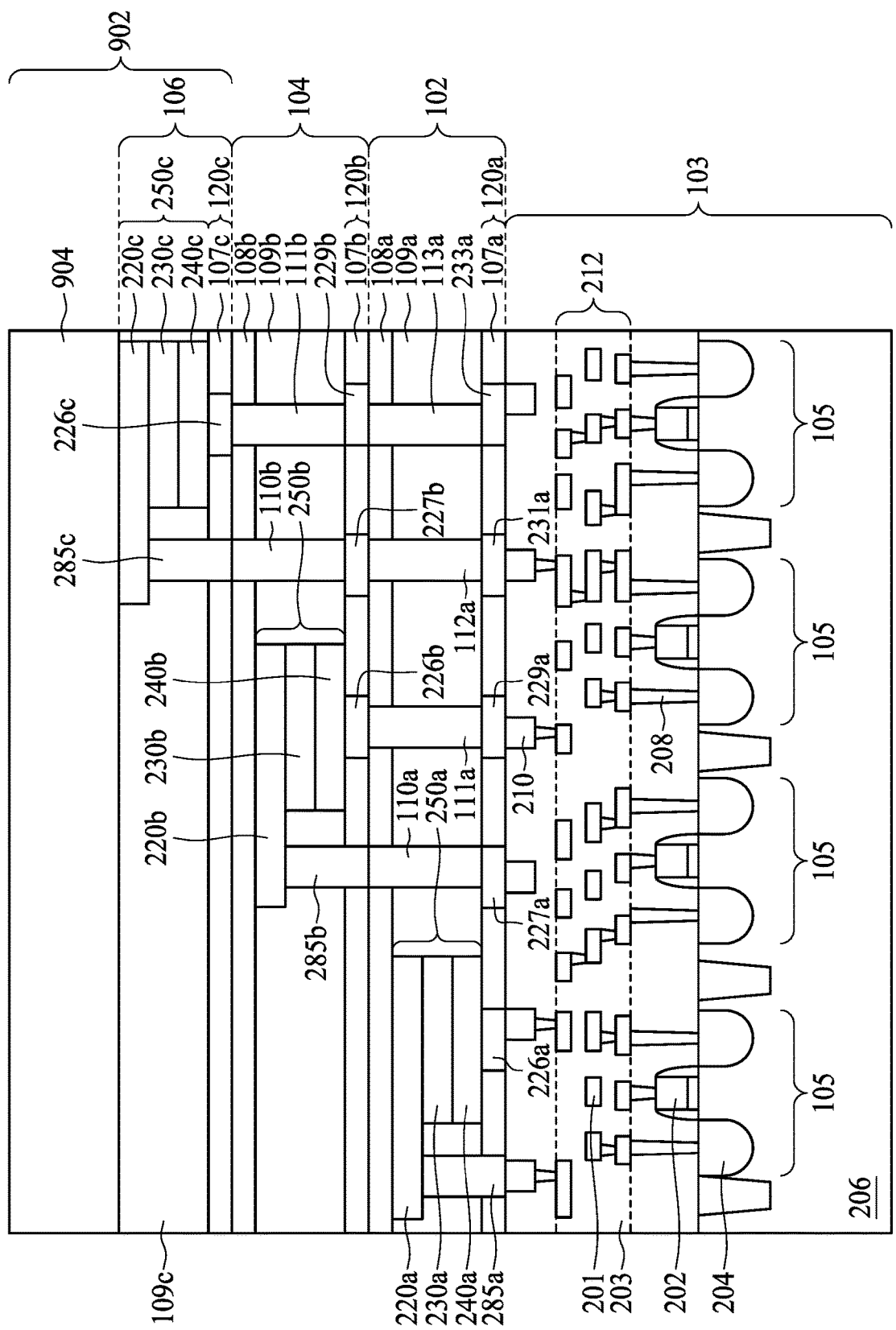

As shown in FIG. 9, a third LED chip 902 is bonded to the second LED layer 104 of the second LED chip 702. The third LED chip 902 includes the epitaxial structure 250c formed on a substrate 904. In an exemplary embodiment, the epitaxial structure 250c is configured as a red light emitting diode. However, this is not a limitation of the present disclosure. When the epitaxial structure 250c is configured as a red light emitting diode, the substrate 904 may be gallium arsenide (GaAs), gallium phosphide (GaP), or other substrate material suitable for LED applications, or combinations thereof. The bonding process may be substantially the same or similar to the bonding process of the first LED chip 302 and the CMOS chip 103, and the bonding process of the second LED chip 702 and the first LED layer 102. Therefore the details are omitted here for conciseness.

Figure 10:
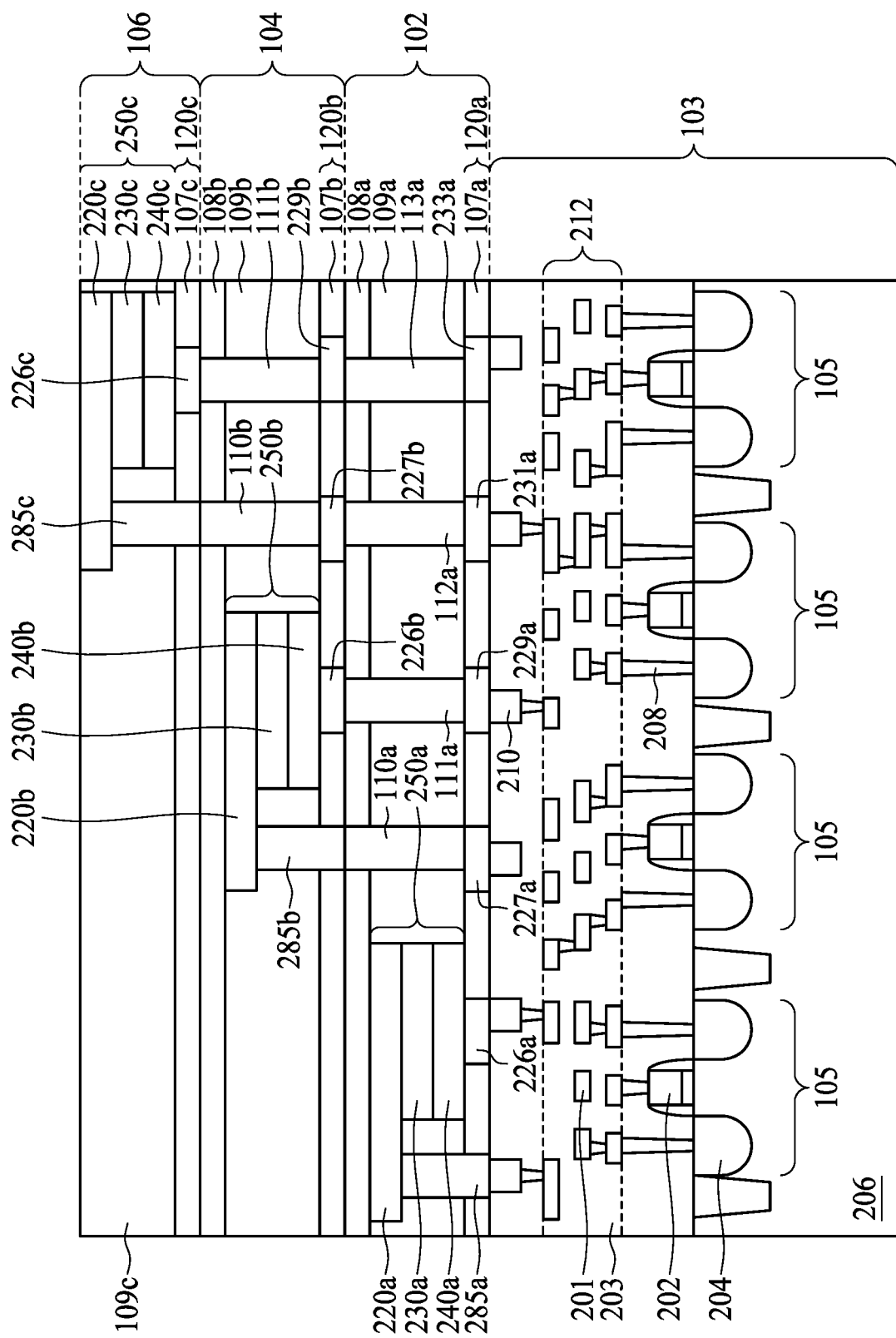
Figure 11:
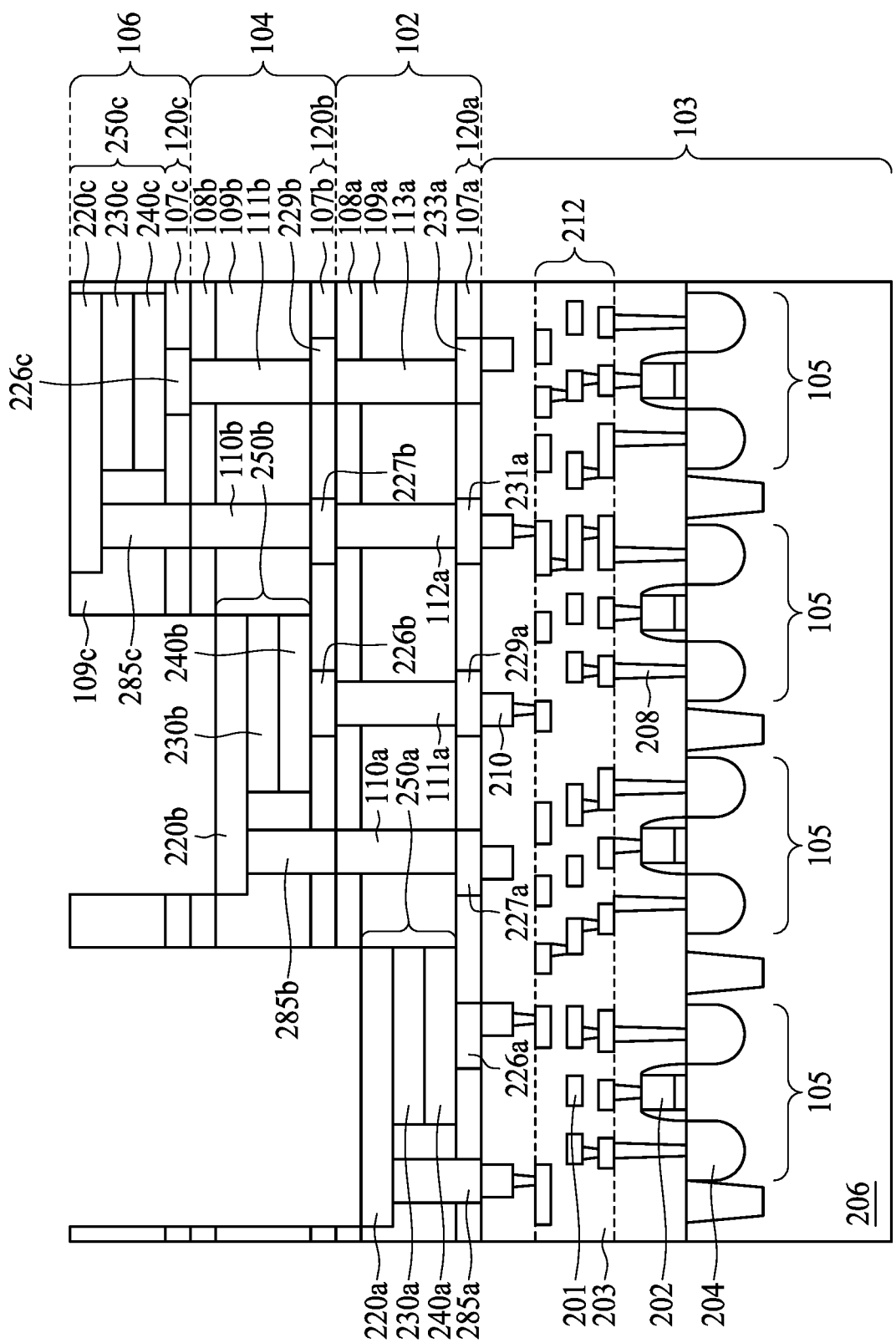

With reference to FIG. 10, the substrate 904 may be removed through a process substantially the same or similar to the removal of the substrate 304 and substrate 704. As shown in FIG. 11, a portion of the dielectric material 108a, the second LED layer 104 and the third LED layer 106 may be removed through a dry or wet etch to at least fully expose top surfaces of the epitaxy layers 220a and 220b. Referring back to FIG. 1, the transparent filling 110 is applied to cover the first LED layer 102, the second LED layer 104 and the third LED layer 106. The transparent filling 110 fills gaps between the first LED layer 102, the second LED layer 104 and the third LED layer 106 and encompasses the epitaxy layers 220a, 220b and 220c. Micro-lenses may be further formed over the transparent filling 110. In some embodiments, the micro-lenses may be formed by depositing a micro-lens material above the transparent filling 110 (e.g., by a spin-on method or a deposition process).

Some embodiments of the present disclosure provide a semiconductor structure. The semiconductor structure includes: a first light-emitting diode (LED) layer including a first LED of a first color type, the first LED layer having a first side and a second side opposite to the first side; a second LED layer over the first LED layer, the second LED layer including a second LED of a second color type, and the second LED layer having a first side and a second side opposite to the first side; a third LED layer over the second LED layer, the third LED layer including a third LED of a third color type, and the third LED layer having a first side and a second side opposite to the first side; and a transparent filling over the first LED layer, the second LED layer and the third LED layer, wherein a distance between a top surface of the transparent filling and the second side of the first LED layer is greater than a distance between the top surface of the transparent filling and the second side of the second LED layer, and the distance between the top surface of the transparent filling and the second side of the second LED layer is greater than a distance between the top surface of the transparent filling and the second side of the third LED layer; wherein the first color type, the second color type, and the third color type are different from each other, and the first LED, the second LED and the third LED are laterally distanced from each other, so that the first LED, the second LED and the third LED do not overlap each other from a top view.

Some embodiments of the present disclosure provide a semiconductor structure. The semiconductor structure includes: a semiconductor chip, including: a substrate; and an interconnect structure over the substrate; and a stacked light-emitting diode (LED) structure over the semiconductor chip, the stacked LED structure including: a first LED layer, including: a first redistribution layer (RDL) layer including a hybrid bonding interface having metallic regions and dielectric regions; a first LED layer over the first RDL layer; and a first dielectric layer over the first LED layer; and a second LED layer over the first LED layer, including: a second RDL layer; a second LED layer over the second RDL layer; and a second dielectric layer over the second LED layer; wherein the semiconductor chip is bonded to the hybrid bonding interface of the stacked LED structure.

Some embodiments of the present disclosure provide a method of manufacturing a semiconductor structure. The method includes: receiving a semiconductor chip, a first LED chip and a second LED chip, wherein the first LED chip having a substrate; hybrid-bonding the first LED chip to the semiconductor chip; removing the substrate of the first LED chip; and hybrid-bonding the second LED chip to the first LED chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a semiconductor chip, a first light-emitting diode (LED) layer including a first LED of a first color type, the first LED layer having a bottom side and a top side opposite to the bottom;
   bonding the first LED layer to the semiconductor chip;
   forming a conductive structure in the first LED layer;

bonding a second LED layer to the first LED layer to couple the second LED layer to the semiconductor chip through the conductive structure, the second LED layer including a second LED of a second color type, and the second LED layer having a bottom side and a top side opposite to the bottom side;

bonding a third LED layer to the second LED layer, the third LED layer including a third LED of a third color type, and the third LED layer having a bottom side and a top side opposite to the bottom side; and applying a transparent filling over the first LED layer, the second LED layer and the third LED layer, wherein a distance between a top surface of the transparent filling and the top side of the first LED layer is greater than a distance between the top surface of the transparent filling and the top side of the second LED layer, and the distance between the top surface of the transparent filling and the top side of the second LED layer is greater than a distance between the top surface of the transparent filling and the top side of the third LED layer;

wherein the first color type, the second color type, and the third color type are different from each other, and the first LED, the second LED and the third LED are laterally distanced from each other, so that the first LED, the second LED and the third LED do not overlap each other from a top view.

2. The method of claim 1, wherein receiving the first LED layer comprises:
receiving a first LED chip including the first LED layer formed on a first substrate; and
removing the first substrate.

3. The method of claim 2, wherein bonding the second LED layer to the first LED layer comprises:
receiving a second LED chip including the second LED layer formed on a second substrate;
bonding the second LED chip to the first LED layer; and
removing the second substrate.

4. The method of claim 3, wherein bonding the third LED layer to the second LED layer comprises:
receiving a third LED chip including the third LED layer formed on a third substrate;
bonding the third LED chip to the second LED layer; and
removing the third substrate.

5. The method of claim 4, wherein the first LED layer further includes a first redistribution layer (RDL) at the bottom side of the first LED layer, the second LED layer further includes a second RDL at the bottom side of the second LED layer, and the third LED layer further includes a third RDL at the bottom side of the third LED layer.

6. The method of claim 5, wherein the first color type is blue, the second color type is green and the third color type is red.

7. The method of claim 6, wherein bonding the second LED chip to the first LED layer comprises:
bonding the second LED chip to the top side of the first LED layer through metal-to-metal bonding.

8. The method of claim 7, wherein bonding the third LED chip to the second LED layer comprises:
bonding the third LED chip to the top side of the second LED layer through metal-to-metal bonding.

9. The method of claim 8, further comprising:
receiving a semiconductor chip; and
bonding the first LED chip to the semiconductor chip.

10. The method of claim 9, wherein the first LED layer is coupled to the semiconductor chip through the first RDL, the second LED is coupled to the semiconductor chip through the second RDL and the first LED layer, and the third LED is coupled to the semiconductor chip through the third RDL, the second LED layer and the first LED layer.

11. A method of manufacturing a semiconductor structure, comprising:
providing a semiconductor chip, including:
a substrate; and
an interconnect structure over the substrate; and
bonding a first LED chip to the interconnect structure of the semiconductor chip, the first LED layer including:
a first redistribution layer (RDL) layer including a hybrid bonding interface having metallic regions and dielectric regions;
a first LED layer over the first RDL layer; and
a first dielectric layer over the first LED layer; and
bonding a second LED chip to the first LED chip, the second LED chip including:
a second RDL layer;
a second LED layer over the second RDL layer; and
a second dielectric layer over the second LED layer.

12. The method of claim 11, wherein bonding the first LED chip to the interconnect structure of the semiconductor chip comprises:
bonding the first RDL layer of the first LED chip to the interconnect structure of the semiconductor chip.

13. The method of claim 12, wherein a ratio of a pitch of the metallic regions to a line width of the metallic regions is no greater than about 5:1, and
the first LED layer includes:
a dielectric material; and
a first epitaxial LED structure of a first color type laterally encompassed by the dielectric material of the first LED layer; and
the second LED layer includes:
a dielectric material; and
a second epitaxial LED structure of a second color type laterally encompassed by the dielectric material of the second LED layer;
wherein the first color type is different from the second color type.

14. The method of claim 13, further comprising:
removing a portion the dielectric material of the second LED chip to expose the first epitaxial LED structure.

15. The method of claim 13, wherein the first epitaxial LED structure is coupled to the semiconductor chip through the first RDL layer.

16. The method of claim 15, further comprising:
forming a conductive structure passing through the first dielectric layer and the dielectric material of the first LED layer.

17. The method of claim 16, wherein bonding the second LED chip to the first LED chip comprises:
bonding the second RDL layer of the second LED chip to the first LED chip, and the second epitaxial LED structure is coupled to the semiconductor chip through the second RDL layer and the conductive structure.

18. The method of claim 17, wherein the first epitaxial LED structure is laterally distanced from the second epitaxial LED structure by a width greater than 0, and the first epitaxial LED structure is free from overlapping the second epitaxial LED structure from a top view.

19. A method of manufacturing a semiconductor structure, comprising:
receiving a semiconductor chip, a first LED chip and a second LED chip;
hybrid-bonding the first LED chip to the semiconductor chip;

forming a conductive structure in the first LED chip;
coupling the second LED chip to the semiconductor chip through the conductive structure;
removing a substrate of the first LED chip; and
hybrid-bonding the second LED chip to the first LED chip.

20. The method of claim 19, further comprising:
forming a conductive structure in the second LED chip.

\* \* \* \* \*